United States Patent
Vallade et al.

(10) Patent No.: US 12,125,681 B2
(45) Date of Patent: Oct. 22, 2024

(54) FACILITY FOR TREATING THE SURFACE OF A MOVING SUBSTRATE IN A CONTROLLED ATMOSPHERE, AND METHOD FOR DEFINING THE SIZE THEREOF

(71) Applicant: COATING PLASMA INNOVATION, Fuveau (FR)

(72) Inventors: Julien Vallade, Trets (FR); Cédric Pfister, Rousset (FR)

(73) Assignee: Coating Plasma Innovation, Faveau (FR)

( * ) Notice: Subject to any disclaimer, the term of this patent is extended or adjusted under 35 U.S.C. 154(b) by 599 days.

(21) Appl. No.: 16/344,303

(22) PCT Filed: Oct. 27, 2017

(86) PCT No.: PCT/FR2017/052827
§ 371 (c)(1),
(2) Date: Apr. 23, 2019

(87) PCT Pub. No.: WO2018/078237
PCT Pub. Date: May 3, 2018

(65) Prior Publication Data
US 2019/0259576 A1     Aug. 22, 2019

(30) Foreign Application Priority Data

Oct. 27, 2016  (FR) ........................................ 1660427
May 22, 2017  (FR) ........................................ 1754494

(51) Int. Cl.
*H01J 37/32*     (2006.01)
*C23C 16/455*    (2006.01)
*C23C 16/54*     (2006.01)

(52) U.S. Cl.
CPC .... *H01J 37/3244* (2013.01); *C23C 16/45593* (2013.01); *C23C 16/545* (2013.01); *H01J 37/3277* (2013.01)

(58) Field of Classification Search
CPC ............. H01J 37/32449; H01J 37/3277; H01J 37/32532; H01J 37/32825;
(Continued)

(56) References Cited

U.S. PATENT DOCUMENTS 5,314,539 A * 5/1994 Brown .................... B29C 59/14
                                                      118/718
5,576,076 A * 11/1996 Slootman .............. C23C 16/402
                                                      427/255.37
(Continued)

FOREIGN PATENT DOCUMENTS

EP    2 298 956 A1    3/2011
FR    2 816 726       5/2002
(Continued)

OTHER PUBLICATIONS

International Search Report mailed Nov. 30, 2017 from corresponding International Application No. PCT/FR2017/052827.
(Continued)

*Primary Examiner* — Parviz Hassanzadeh
*Assistant Examiner* — Nathan K Ford
(74) *Attorney, Agent, or Firm* — Jordan IP Law, LLC; Todd A. Vaughn

(57) ABSTRACT

This facility comprises a support (1) for the substrate, a pressing roll (2), capable of pressing the substrate against said support, a treatment unit positioned downstream of the pressing roll, with reference to the direction of travel of the substrate, said unit comprising injection means (37) for injecting a treatment gas towards said support and means (8) for transforming the surface of the moving substrate.
(Continued)

According to the invention, this facility further comprises a containment cover (4) open in the direction of the support, this cover and this support defining an inner volume in which said treatment unit is received, this cover comprising a front wall called the upstream wall (42), facing towards said pressing roll, wherein the smallest distance (d2) between the end edge (42') of said upstream front wall and the pressing roll, the smallest distance (d3) between said upstream front wall (42) and the treatment unit and the smallest distance (d1) between the upstream end (39) of the treatment unit and the support (1), are such that they define a recirculation volume (VR) for the treatment gas, defined by the end edge of said upstream front wall, the pressing roll, the support and the upstream end of the treatment unit.

13 Claims, 8 Drawing Sheets

(58) Field of Classification Search
CPC ........ C23C 16/45517; C23C 16/45574; C23C 16/45595; C23C 16/45582; C23C 16/545
USPC .......................................................... 118/718
See application file for complete search history.

(56) References Cited

U.S. PATENT DOCUMENTS

| | | | |
|---|---|---|---|
| 6,082,292 A * | 7/2000 | Denes | B29C 59/14 |
| | | | 118/729 |
| 6,458,330 B1 | 10/2002 | Cocolios et al. | |
| 2014/0208565 A1 | 7/2014 | Lotz et al. | |
| 2018/0144910 A1* | 5/2018 | Gat | H01J 37/32449 |

FOREIGN PATENT DOCUMENTS

| | | |
|---|---|---|
| FR | 3 035 122 | 10/2016 |
| JP | 2016/062812 | 4/2016 |
| WO | WO 2008/136029 A1 | 11/2008 |

OTHER PUBLICATIONS

French Search Report mailed Jun. 26, 2017 from corresponding French Application No. 1660427.

* cited by examiner

---- WITHOUT NIP
—— WITH NIP

FACILITY FOR TREATING THE SURFACE OF A MOVING SUBSTRATE IN A CONTROLLED ATMOSPHERE, AND METHOD FOR DEFINING THE SIZE THEREOF

This application is a U.S. national phase application of International Application No. PCT/FR2017/052827, filed Oct. 16, 2017, which claims priority to French Application No. 1660427 filed Oct. 27, 2016 and French Application No. 1754494 filed May 22, 2017 the disclosures of which are all hereby incorporated by reference herein.

TECHNICAL FIELD OF THE INVENTION

The invention relates to a facility for treating the surface of a moving substrate, intended to be used in a controlled atmosphere. It relates for example to such a facility in which the substrate is subjected to a plasma generated in a gaseous mixture, which leads to the modification of the surface state of the substrate and/or to the formation of a deposit on the aforementioned surface. The invention relates in particular to such a facility, which can be used at a pressure close to atmospheric pressure, and which is suitable for the continuous surface treatment of polymer films in rolls (a method of the "roll-to-roll" type).

PRIOR ART

The surface treatment facility within the meaning of the invention comprises in particular means for injecting a treatment gas, as well as means for transforming the surface of the moving substrate. In the case where the facility uses a plasma treatment, the treatment gas comprises in particular a plasma-forming gas, whereas the transformation means comprise electrodes able to generate an electrical discharge. In the case where the facility uses visible ultraviolet radiation for crosslinking photosensitive resins, the treatment gas is an inerting gas, whereas the transformation means comprise means for crosslinking the resin, cooperating with means for distributing these resins on the surface of the substrate.

Facilities are already known, aimed at modifying and improving the surface properties of a substrate by means of a plasma. Such properties of interest may for example be the surface energy or the adhesion properties of this substrate. The substrates to which the invention relates may in particular be insulators such as polymer films, metal films, paper or fabric.

In the use of these known facilities, with a view to the deposition of a thin solid layer on the surface of a substrate, this surface is subjected to a plasma created by an electrical discharge in a gas. Moreover, simultaneously or subsequently, the substrate thus treated is exposed to a gaseous mixture that contains an active gaseous compound, able to cause the deposition of this thin solid film.

Continuously implementing methods for the treatment of a substrate by means of an electrical discharge in a gaseous mixture are also known, wherein the substrate is moved at speeds that may range up to several hundreds of meters per minute, particularly in a chamber. The latter, apart from the electrodes necessary for creating the discharge, contains a device for injecting the active gaseous mixture, as well as means for discharging gaseous effluents.

The invention relates particularly, but not exclusively, to a plasma treatment facility, in particular such as a facility that operates substantially at atmospheric pressure. In this type of facility, controlling the composition of the atmosphere in the plasma zone is critical for the efficacy of the treatment. To do this in the roll-to-roll methods, large quantities of plasma-forming gas are injected into the treatment zone in order to discharge the air and maintain a low oxygen level, typically below 50 ppm (parts per million). However, the substrate that passes in the plasma zone entrains with it a certain quantity of air in a layer in the vicinity of the surface referred to as a "boundary layer". The entry of this air into the plasma zone, and in particular of the oxygen that the air contains, has a tendency to interfere with the correct functioning of the treatment.

In order to remedy this drawback, FR-A-2 816 726 proposed a facility of the aforementioned type that is provided with auxiliary units for respectively preventing the entry of air into the chamber and the discharge of the gaseous mixture out of this chamber. Each auxiliary unit comprises a nitrogen-injection slot allowing the creation, in service, of gaseous "blades". Means are also provided for regulating the gaseous flows so as to maintain a pressure difference close to zero between the inside of the chamber and the external atmosphere.

However, the method described in FR-A-2 816 726 involves certain drawbacks. First of all it uses gaseous blades that involve a particularly high consumption of nitrogen. In addition, controlling the conditions inside the chamber is relatively complex. In particular, the pressure inside the chamber is difficult to regulate in a stable and reproducible fashion. In other words, this pressure is subject to substantial variations, which are not favorable to the correct control of this method. Finally, the facility described in FR-A-2 816 726, allowing the implementation of this method, is relatively heavy and expensive.

An alternative solution, aimed at eliminating this boundary layer, was proposed by WO 2008/136029. This document describes a facility for the plasma treatment at atmospheric pressure of a material in a continuous strip, comprising a closed chamber intended for receiving a plasma treatment station. This chamber is provided with a sealing system associated with lips pressing, in service, on the passing substrate to be treated. This arrangement also has limits, in particular in that it does not allow a high treatment speed. Moreover, it does not lend itself to the treatment of substrates such as films, since it is liable to create unwanted scratches on the surface thereof.

Mention can also be made of JP 2016/062812, which describes a facility using at least one treatment station, in which a plasma-forming gas admission chamber is provided. According to the teaching of this document, the distance separating the traveling substrate and the opposite face of the treatment station is small in order to minimize the entry of air. However, the efficacy of such a facility proves to be insufficient, in particular in the case where the substrate is to be treated at high speed.

The use is also known, at the entry to the treatment zone, of a presser roller, the function of which is to press the substrate onto the support roller in order to prevent the formation of air pockets under the substrate. Such a device, which is very widely used and described in the prior art, does however prove to be insufficient with a view to solving the technical problem relating to the inerting of the treatment zone.

Finally, FR 3 035 122 describes a treatment facility comprising a chamber, a support for the substrate, a counterelectrode, at least one head provided with at least one electrode suitable for creating an electrical discharge, and means for diffusing an inert gas and means for injecting an active gaseous mixture towards the support. According to the teaching of this document, the injection means are placed between the diffusion means and the support, whereas the head and the support define at least one outlet for the inert gas and/or the active gaseous mixture.

Having regard to the above, one objective of the present invention is to at least partially remedy the drawbacks of the prior art mentioned above.

Another objective of the invention is to propose a judicious sizing of a facility for surface treatment in a controlled atmosphere, so as to increase the efficacy of the inerting of the treatment zone belonging to this facility.

Another objective of the invention is to propose such a facility, making it possible to maximize the effect of the treatment in order to be able to treat flexible substrates at high speed.

Another objective of the invention is to propose such a facility which, while providing a reliable surface treatment of a substrate, in particular of the "roll-to-roll" type, at a pressure close to atmospheric pressure, makes it possible to significantly reduce the quantity of gas consumed, compared with the prior art.

Another objective of the invention is to propose such a facility which is convenient to control and which can be used in a relatively simple fashion.

OBJECTS OF THE INVENTION

According to the invention, the above objectives are achieved first of all by means of a facility for treating the surface of a moving substrate (SUB), comprising
a support (1; 101; 201) for the substrate,
a pressing roll (2; 102; 202) able to press the substrate against said support
a treatment unit positioned downstream of the pressing roll, with reference to the direction of travel of the substrate, said unit comprising
injection means (37; 137, 137', 137"; 237, 237') for injecting a treatment gas towards said support;
means (8; 108, 108', 108"; 208, 208') for transforming the surface of the moving substrate; characterized in that this facility further comprises
a containment cover (4; 104; 204) open in the direction of the support, this cover and this support defining an inner volume in which said treatment unit is received, this cover comprising a front wall called the upstream wall (42; 142; 242), facing towards said pressing roll, the end edge (42'; 142'; 242') of said upstream front wall (42' 142; 242) being positioned in the vicinity of said pressing roll (2; 102; 202); and
means (5; 37; 137; 237') for recirculating some of the treatment gas upstream of said injection means,
so as to define a recirculation volume (VR) for the treatment gas, defined by the end edge of said upstream front wall, the pressing roll, the support and the upstream end of the treatment unit.

The facility according to the invention uses a so-called treatment gas, the nature of which varies according to the various types of treatment, encompassed within the context of the invention. Thus, in a first embodiment, the treatment of the invention is a plasma treatment. In this case, the treatment gas comprises in particular a plasma-forming gas, optionally associated with doping agents. In an alternative embodiment, the treatment of the invention is the crosslinking of photosensitive resins. In this case, the treatment gas is an inerting gas. The nature of this treatment gas may again be different, in the case of another type of treatment according to the present invention.

Generally, the term inerting gas could be given to any gas for driving the oxygen out of the volume of the containment volume, independently of any other function. Typically, this definition comprises gases such as nitrogen and noble gases, among others helium or argon. A plasma-forming gas, used in the plasma treatment, enables plasma to be created. It corresponds to the inerting gas in other methods, since it also has the function of driving the oxygen out of the volume of the containment cover.

It is to the merit of the applicant that they found that the drawbacks of the prior art are, to a major extent, due to the fact that the air present downstream of the pressing roll inhabits the boundary layer before entering the treatment zone proper. The applicant further identified that this phenomenon is in particular related to an inappropriate mutual positioning of the various elements constituting the facility, namely the drum, the pressing roll and the treatment unit. In particular, the applicant realized that, though this pressing roll makes it possible to eliminate the layer of air between the substrate and the support drum, this pressing roll is not sufficient to eliminate the layer of air present above this substrate.

Under these circumstances, the invention makes provision for the wall to house the treatment unit within a containment cover. The recirculation means according to the invention make it possible to recirculate some of the treatment gas injected by the injection means. The recirculation path lies outside these injection means, but inside the volume formed by the cover and the opposite substrate.

All or some of the treatment gas thus recirculated is then admitted into a recirculation volume, defined according to the invention by the end edge of the upstream front wall of the cover, by the pressing roll, by the support and by the upstream end of the treatment unit. Positioning this end edge as close as possible to the pressing roll facilitates the driving of the ambient air, by means of the treatment gas present in this recirculation volume. In other words, any significant entry of ambient air into this recirculation volume and consequently in the direction of the treatment zone is prevented.

The invention therefore relies in particular on a judicious sizing of the treatment facility that is the subject matter thereof. The applicant found that controlling certain dimensional parameters of this facility makes it possible to eliminate, mechanically, the boundary layer of air on the surface of the substrate before it enters the treatment zone.

This structure thus makes it possible to obtain a substrate without a boundary layer of air, while conferring high treatment speeds, typically around 100 to 800 m/min. It should also be noted that the invention does not give rise to any significant increase in the consumption of treatment gas. In addition, the invention makes it possible to dispense with the use of inlet and outlet units associated with nitrogen blades, as known from FR-A-2 816 726. The overall structure of the facility according to the invention is consequently appreciably simplified thereby.

Finally, it should be noted that the structure of the facility according to the invention differs substantially from that described in FR 3 035 122, presented above. This is because this prior document does not describe a containment cover that is distinct from the treatment unit. Moreover, in this document, the pressing roll is distant from the treatment unit so that it is not of such as nature as to define a recirculation volume with this treatment unit.

According to other additional features of the invention, of an optional nature:

said containment cover (4; 104; 204) is distinct from said treatment unit, the smallest distance (d2) between the end edge (42'; 142'; 242') of said upstream front wall (42; 142; 242) and the pressing roll (2; 102; 202) is less than 15 millimeters, preferably less than 5 millimeters, the smallest distance (d3) between said upstream front wall (42; 142; 242) and the treatment unit is less than 20 millimeters, preferably less than 2 millimeters, the smallest distance (d1) between the upstream end of the treatment unit and the support (1; 101; 201) is less than 5 millimeters, preferably less than 2 millimeters, the injection means comprise at least one first injection member (37; 137; 237) and the means for recirculating the treatment gas comprise at least one mechanical deflector (5), placed downstream of said first injection member, the injection means comprise at least one first injection member (37; 137; 237) and the means for recirculating the treatment gas comprise at least one second injection member (37, 137, 237') placed downstream of said first injection member, the smallest distance (d5) between the pressing roll (2) and the treatment unit is less than 10 millimeters, preferably less than 5 millimeters, a pathway (6; 106; 206) for recirculating the treatment gas is provided, in which said gas flows substantially radially towards the outside with reference to the support, this return pathway being provided upstream of the recirculation means (5; 37; 137; 237'), this recirculation pathway has a cross-section (d4) lying between (d1) and 10 mm, preferably between (d1) and 2*(d1), where (d1) is the smallest distance between the upstream end of the treatment unit and the support, the treatment unit comprises at least one solid block (3A-3D) in which outlet orifices (37) for the treatment gas are pierced, the upstream end of the upstream block defining the upstream end of the treatment unit, a housing for receiving at least one electrode furthermore being provided in this solid block, the outlet orifices (37) for the treatment gas are pierced in the bottom wall, facing the drum, of said solid block, said bottom wall being substantially solid with the exception of said orifices, the region of the bottom wall situated between the outlet orifices and the housing is solid, the treatment unit comprises a plurality of solid blocks placed one behind the other in the direction of travel of the substrate, the facing ends of the two most upstream adjacent blocks defining said return pathway, the treatment unit comprises at least one head (103A, 103B) defining an internal volume (V103) open in the direction of the support, said head comprising an upstream lateral wall the end edge of which defines the upstream end of the treatment unit, the treatment unit comprises a succession of gas-injection members (237, 237') and electrodes (208, 208') directly fixed to the containment cover, the upstream injection member defining the upstream end of the treatment unit.

These additional features can be implemented individually or in any technically compatible combinations.

The aforementioned objectives are also achieved by means of a method for sizing a facility for the surface treatment of a moving substrate (SUB), comprising a support (1; 101; 201) for the substrate, a pressing roll (2; 102; 202) able to press the substrate against said support, a treatment unit positioned downstream of the pressing roll, with reference to the direction of travel of the substrate, said unit comprising injection means (37; 137, 137', 137"; 237, 237') for injecting a treatment gas towards said support;

means (8; 108, 108', 108"; 208, 208') for transforming the surface of the moving substrate; characterized in that the following are also provided a containment cover (4; 104; 204) open in the direction of the support, this cover and this support defining an inner volume in which said treatment unit is received, this cover comprising a front wall called the upstream wall (42; 142; 242), facing towards said pressing roll, and means (5; 37; 137; 237') for recirculating some of the treatment gas upstream of said injection means, and the end edge (42'; 142'; 242') of said upstream front wall (42; 142; 242) is positioned in the vicinity of said pressing roll (2; 102; 202) so as to define a volume (VR) for recirculation of the treatment gas, delimited by the end edge of said upstream front wall, the pressing roll, the support and the upstream end of the treatment unit.

This sizing method can be implemented using the above additional features, individually or in any technically compatible combinations.

DESCRIPTION OF THE FIGURES

The invention will be described below with reference to the accompanying drawings given solely by way of non-limitative examples, wherein.

The following numerical references are used in the present description:

| | |
|---|---|
| 1 Drum | R1 Rotation of 1 |
| D1 Diameter of 1 | L1 Length of 1 |
| 2 Lip (pressing roll) | R2 Rotation of 2 |
| D2 Diameter of 2 | L2 Length of 2 |
| SUB Substrate | F1 F2 Movement of SUB |
| 3A-3D Blocks | 31 36 Top bottom walls of 3 |
| 32 33 Upstream downstream walls of 3 | 34 35 Lateral walls of 3 |
| 37 Injection orifices of 3 | 37' Supply to 37 |
| 38 Housing of 8 | 8 Electrode |
| 39 Upstream end of 3 | 39' Upstream top edge of 3 |
| 4 Containment cover | 41 Top wall of 4 |
| 42 43 Upstream downstream walls of 4 | 44 45 Lateral walls of 4 |
| d1 Distance between 39 and 1 | d2 distance between 42 and 2 |
| d3 Distance between 42 and 39' | d4 Distance between 33 and 32B |
| d5 Distance between 32 and 2 | |
| 5 Deflector | 6 Return pathway |
| 101 Drum | 102 Nip (pressing roll) |
| 103A 103B Heads | 131 Cover |
| 132 Front wall of 103 | 133 Rear wall of 103 |
| 134 Lateral wall of 103 | 135 Lateral wall of 103 |
| 104 Containment cover | V103 Internal volume of 103 |
| 132' 133' Free edges | E S Inlet Outlet |
| 142 Diffusers | 140 150 Parts of the head |
| 160 Filter | 137-137" Tubes |
| 108-108" Electrodes | 106 Return pathway |
| 201 Drum | 202 Nip (pressing roll) |
| 204 Containment cover | 208-208' Electrodes |
| 206 Return pathway | 237-237' Tubes |

DETAILED DESCRIPTION

Figure 1:
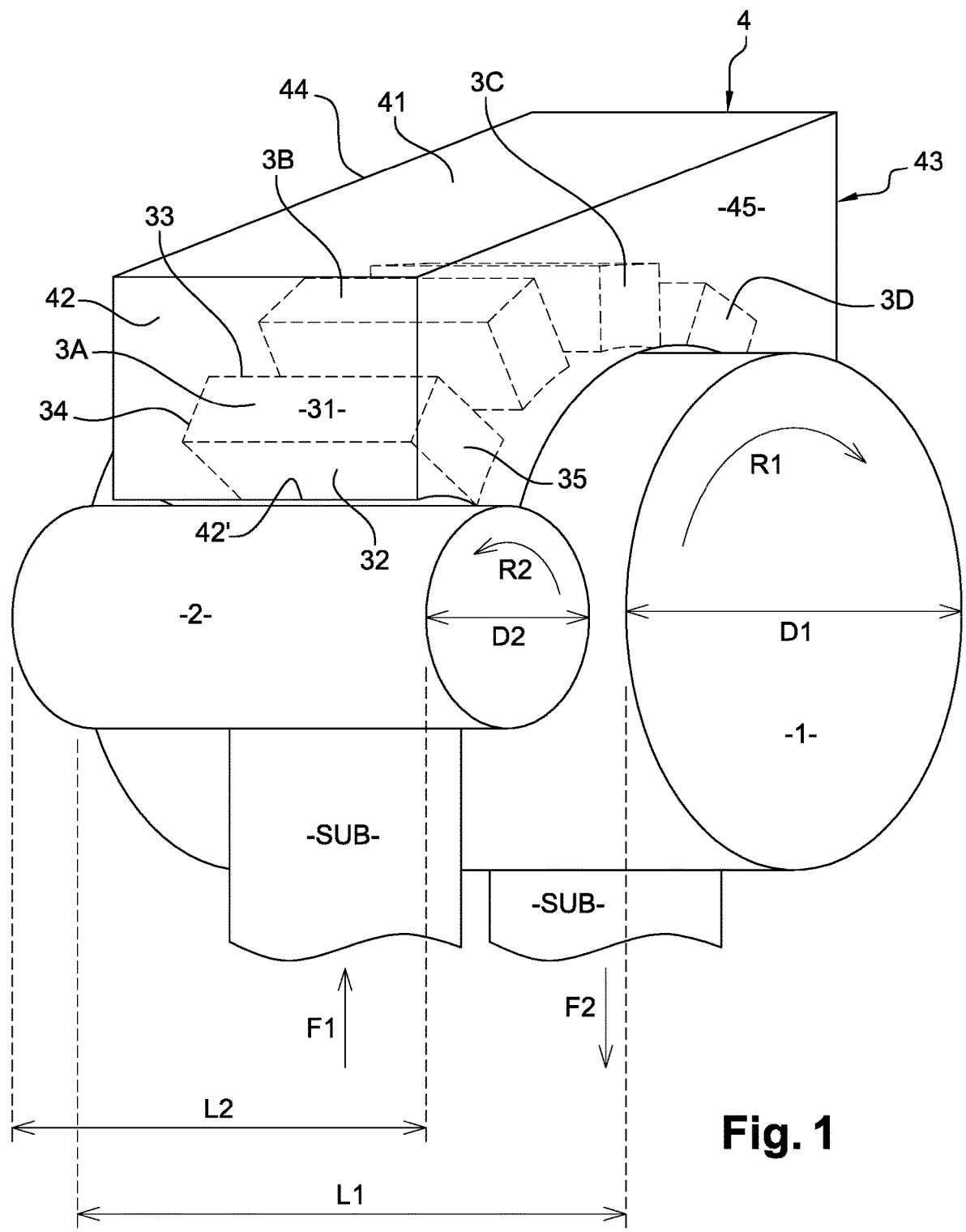
FIG. 1 is a perspective view illustrating a surface-treatment facility according to a first embodiment of the invention.
Figure 2:
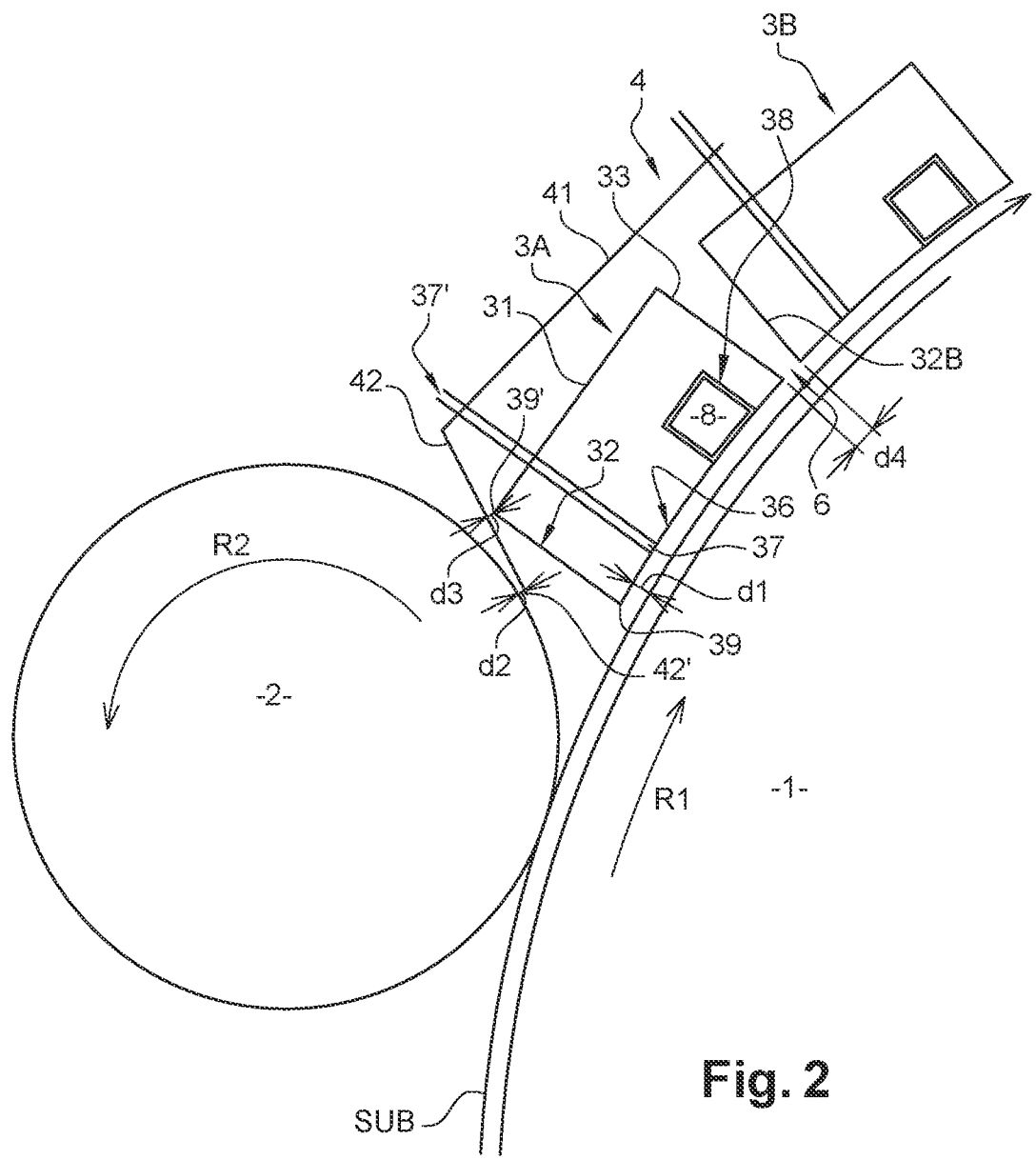
FIG. 2 is a front view partially illustrating, to a much larger scale, the respective positioning of the drum, the pressing roll and the treatment blocks, forming part of the facility according to the invention.
Figure 3:
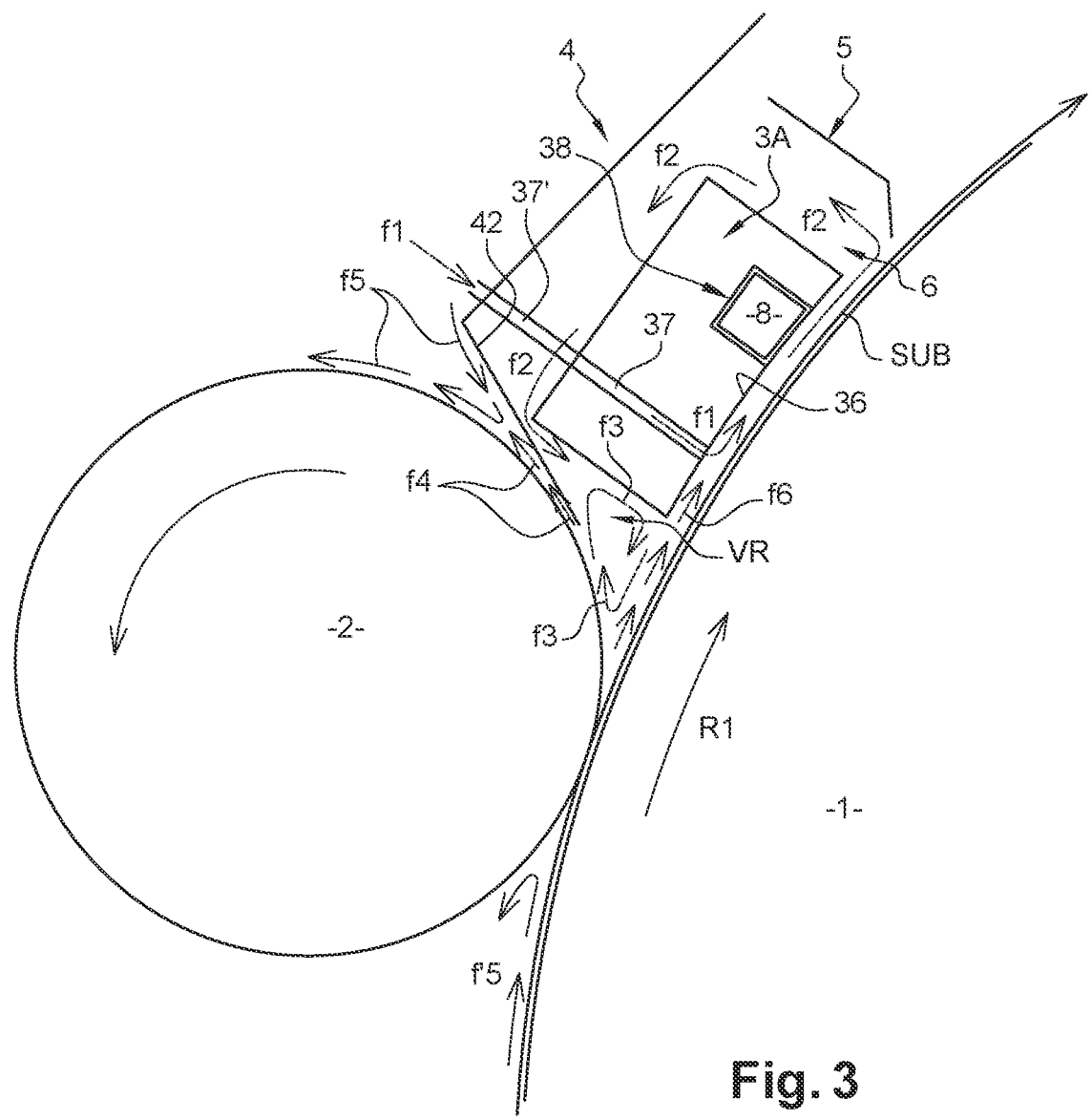
FIG. 3 is a front view, similar to FIG. 2, illustrating the circulation of the gases during use of the facility according to the invention.

FIGS. 1 to 3 illustrate a surface-treatment facility according to a first variant embodiment of the invention. As these figures show, this facility comprises essentially a drum 1, forming a support for a substrate SUB, a pressing roll 2, a treatment unit formed by a plurality of treatment blocks 3A to 3F, and a containment cover 4 covering these blocks.

The drum 1, of a type known per se, is rotated in service in the direction represented by the arrow R1. Its diameter is denoted D1 and its longitudinal dimension L1. This drum forms a support for the substrate SUB, intended to travel in the direction of the arrows F1 and F2, so as to be treated in accordance with the invention. In the present embodiment, this drum fulfils an additional function of counterelectrode, which cooperates with electrodes that will be described hereinafter. To this end, this drum is advantageously covered with an insulating layer, in a manner known per se. However, this counterelectrode may be formed by another component of the facility. By way of example, the substrate is made from polypropylene while the thickness thereof is between 20 and 100 micrometers.

In its upstream part, with reference to the movement of the substrate, the drum 1 is associated with the pressing roll 2 (also referred to by a person skilled in the art as "nip"), also of a type known per se. As will be described in more detail hereinafter, the secondary roll 2 is rotated in service in the direction represented by the arrow R2. This makes it possible to press the substrate against the drum 1 so as to prevent the formation of a layer of air between this substrate and this drum. This makes it possible to avoid any local defect in treatment on the substrate. Its diameter is denoted D2, which is much smaller than the diameter D1 of the drum 1, and L2 its longitudinal direction, which is for example similar to the longitudinal dimension L1 of the drum 1.

The treatment unit comprises a plurality of solid blocks 3A to 3D, which are advantageously identical. Each block is advantageously produced from an insulating material, of any suitable type. The block is produced by any suitable mechanical method, in particular by machining. The structure of one 3A of these blocks will now be described, knowing that the structure of the other blocks is similar.

The block 3A has a top wall 31 and peripheral walls, formed by parallel walls respectively front or upstream 32, and rear or downstream 33, as well as parallel lateral walls 34 and 35. By way of example, its length L3, namely the distance between the walls 34 and 35, is between 1000 mm and 2000 mm. By way of example, its width 13, namely the distance between the walls 32 and 33, is between 50 mm and 200 mm. Each block is fixed by any suitable means, preferably removably, to the lateral walls of the cover 4, which will be described below.

This block 3A also has a bottom wall 36, turned towards the drum 1. In this first embodiment, this wall 36 is substantially solid. It is hollowed out by at least one orifice 37, allowing the injection of gas into the space formed between this wall 36 and the drum 1. This injection orifice 37 can take the form of a series of holes, distributed linearly or in a zig-zag between the walls 34 and 35, facing the drum 1. Preferably, these orifices are formed by one or more longitudinal slots extending between the walls 34 and 35.

In the example illustrated, there is a single slot 37, but a plurality of parallel slots can be provided, disposed one behind the other with reference to the direction of travel of the substrate. During the use of the facility, as will be explained hereinafter, it is possible to inject both a plasma-forming gas and also an auxiliary gas. At the point where they emerge on the top wall, these orifices 37 are connected to a source, not shown, of any suitable type, for supplying plasma-forming gas and, where applicable, auxiliary gas. These feeds are represented schematically by the reference 37' in FIGS. 2 and 3.

The electrode 8, of a type known per se, is placed in the block 3A, being received for example in a housing 38 provided in this block. This electrode is preferably produced from a ceramic material, which makes it possible to treat an electrically conductive substrate. Alternatively, the electrodes may be produced from any other suitable material, such as a metal material. This electrode 8 is connected to a power source, not shown.

The so-called upstream end of this block 3A is denoted 39, corresponding to the intersection between the respectively upstream 32 and bottom 36 walls. This end 39 also forms the upstream end of the treatment unit. The upstream top end of this block 3A is also denoted 39', corresponding to the intersection between the respectively upstream 32 and top 31 walls.

The facility of the invention also comprises a so-called containment cover 4, the internal volume of which defines a so-called containment chamber, in which the blocks 3 are received. In cross section, this cover 4 has a so-called U shape with splayed wings. By way of variant, it may have different forms such as for example a U with straight wings or a rounded shape. This cover 4 comprises a top wall or web 41, two front walls or wings 42 and 43 and two lateral walls 44 and 45 visible in FIG. 1. With reference to the direction of rotation of the drum, the wing 42 is referred to as the upstream wing while the wing 42 is referred to as the downstream wing.

Figure 8:
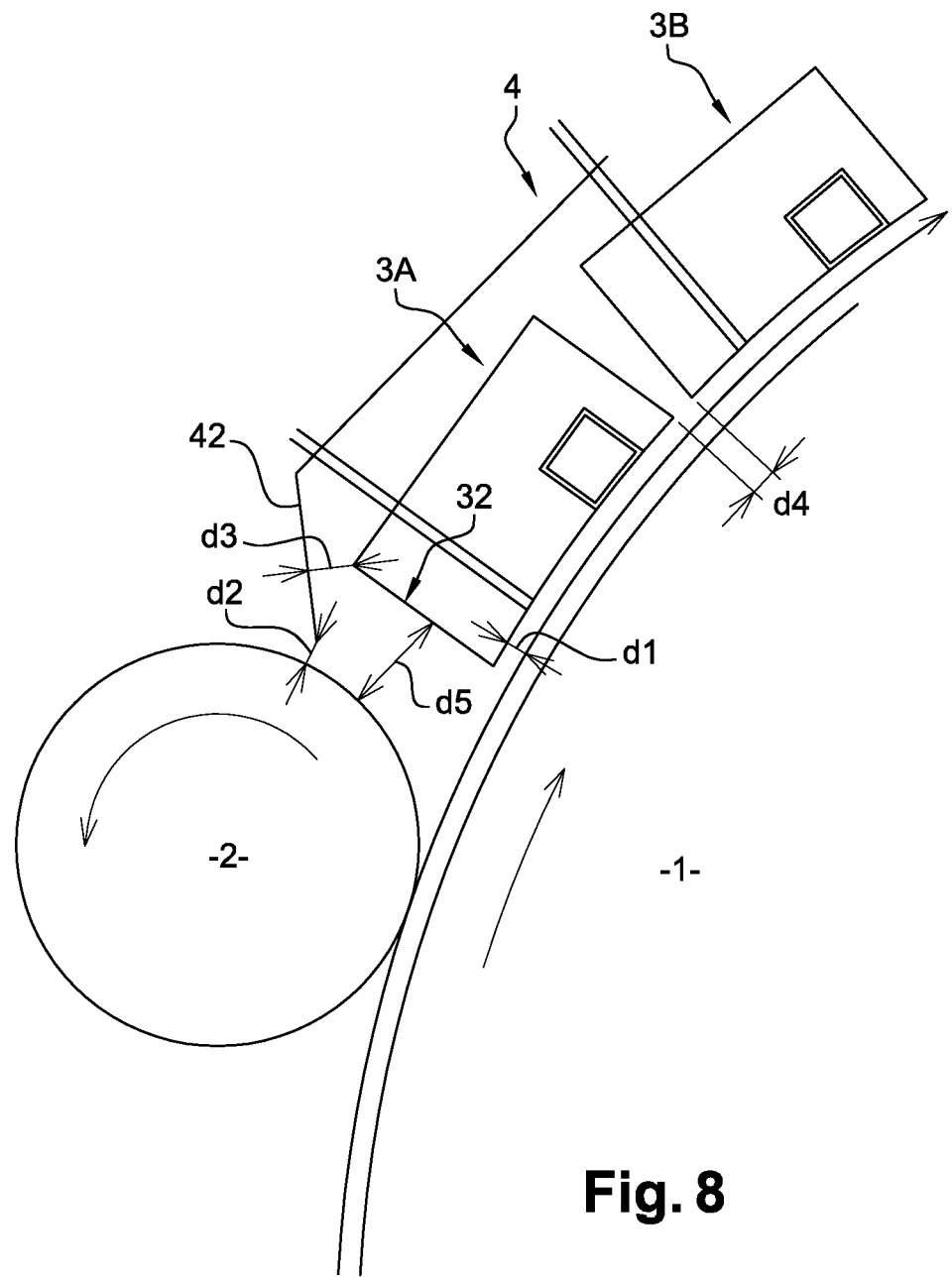
FIG. 8 is a front view similar to FIG. 2 illustrating a variant of the treatment facility according to the first embodiment of the invention.

According to the invention, certain characteristic dimensions in a perfectly defined range of values are advantageously chosen:

the smallest distance (d2) between the end edge 42' of the upstream wall 42 of the cover 4 and the pressing roll 2 is chosen so as to be less than 15 millimeters, preferably less than 5 millimeters;

the smallest distance (d3) between the upstream wall 42 of the cover 4 and the treatment unit is chosen less than 20 millimeters, preferably less than 2 millimeters. This distance separates the aforementioned wall 42 with respect to the top wall 39' of the block 3A;

the smallest distance (d1) between the upstream end 39 of the treatment unit and the support is chosen less than 5 millimeters, preferably less than 2 millimeters;

the smallest distance (d4) between the first treatment block, such as 3A, and the following treatment block, such as 3B, is chosen between d1 and 10 mm, preferably between d1 and 2*d1. In the case of a single treatment block, this distance (d4) separates this treatment block and the facing downstream wall of the containment cover;

the smallest distance (d5) between the pressing roll 2 and the treatment unit is less than 10 millimeters, preferably less than 5 millimeters. This distance is shown in FIG. 8, which illustrates a geometry of the cover 42 that is slightly different from the one shown in FIG. 2. This distance (d5) separates the roll 2 and the upstream wall 32 of the block 3A.

Various possibilities for use of the facility according to the invention will now be explained hereinafter.

In general terms, a treatment gas is admitted into the treatment zone of the facility according to the invention. In the present embodiment, this gas consists of a plasma-forming gas such as nitrogen, argon or helium, to which other gases or vaporized compounds can be added in very much smaller proportions, referred to as dopants.

In general, in a prior phase, plasma-forming gas, such as nitrogen, is admitted first of all into the treatment zone. This admission is carried out through first orifices, provided upstream. The substrate is not moved before the oxygen concentration falls below a given threshold, for example 20 ppm (parts per million). When this concentration is suitable, the substrate is then moved by means of the support and a discharge is generated through the electrodes 8. In addition dopants are optionally injected through second orifices, optionally provided downstream of the orifices admitting plasma-forming gas.

In service, it is found that the facility of the invention makes it possible to create a volume VR, visible in FIG. 3, here referred to as the recirculation volume. In this figure, the path of the air is represented by solid lines, whereas the path of the plasma-forming gas is represented by broken lines. This volume is delimited respectively by three passages with a small cross section:

the first (with a cross section d1) is provided between the upstream end wall 39 of the first block 3A and the substrate SUB travelling on the support roll 1, the second (with a cross section d2) is provided between the pressing roll 2 and the edge 42' of the containment cover 4, and the third (with a cross section d3) is provided between the containment cover 4 and the treatment block 3A.

More precisely, the plasma-forming gas injected out of the orifices 37 flows first of all downstream in the direction of the arrows f1, between the bottom wall 36 and the substrate SUB. In accordance with the invention, this gas is next recirculated partly towards the upstream side of the block 3A, in the direction of the arrows f2. In the example illustrated, this recirculation, or return, phenomenon is provided by the positioning of the second block 3B. This is because the injection of plasma-forming gas carried out at the orifices of this second block 3B makes it possible to prevent the downstream flow of part of the gas injected at 3A and consequently to recirculate this gas. By way of variant, for example in the case where a single block is provided, this recirculation can be provided using a deflector 5 of the mechanical type, forming a return wall, which is illustrated in dot-and-dash lines in FIG. 3. Advantageously, the bottom end of this deflector is placed at a distance (d4), as defined above, from the downstream end facing the block 3A.

The facing walls of the two most upstream blocks 3A and 3B define a recirculation path 6 for the plasma-forming gas, in which the latter flows radially towards the outside of the support 1. The cross section of this recirculation path is equal to the distance (d4), as defined above. In practice, the facility is used so that a suitable proportion of the plasma-forming gas is recirculated upstream, in order to block the ambient air as explained below. Moreover, another proportion of this gas flows freely downstream so as to provide the treatment. Finally, the overall size of the treatment block remains reasonable.

The plasma-forming gas, thus returned upstream, is admitted into the aforementioned volume VR through the space d3. This space is sized so that the shape of the volume above the treatment blocks has no influence on the flow of this gas. For this purpose d3 is less than 20 mm and preferably less than 2 mm. This gas is then subjected to recirculation in this volume VR, in the direction of the arrows f3. Some of this gas inhabits the boundary layer on the pressing roll and is then entrained outside, in the direction of the arrows f4. This prevents the penetration of any air that is sent in the direction of the arrows f5, all the more so since the dimension d2 is small. Another proportion of the plasma-forming gas, which inhabits the boundary layer on the substrate downstream of the pressing roll, is entrained under the block in the direction of the arrows f6. The additional action, of a type known per se, of the pressing roll, which removes the air from the boundary layer in the direction of the arrow f5, has also been illustrated in this FIG. 3.

According to the invention, the edge 42' is positioned as close as possible to the pressing roll 2. In other words, the dimension d2 is as small as possible. A person skilled in the art will adjust the containment cover 4 so that the aforementioned edge 42' is placed in the immediate vicinity of the roll 42, while not interfering with the free rotation thereof. Advantageously, this distance d2 is chosen less than 15 mm, preferably less than 5 mm, as mentioned above.

Preferably, the distance between the pressing roll and the first injection device is minimized as far as possible. This makes it possible to reduce the overall size of the recirculation value and consequently the time necessary for inerting this volume VR. No gas aspiration device is placed in the internal volume of the containment cover. On the other hand, such an aspiration device is advantageously provided in the chamber with the largest size receiving all the components of the facility.

Figure 4:
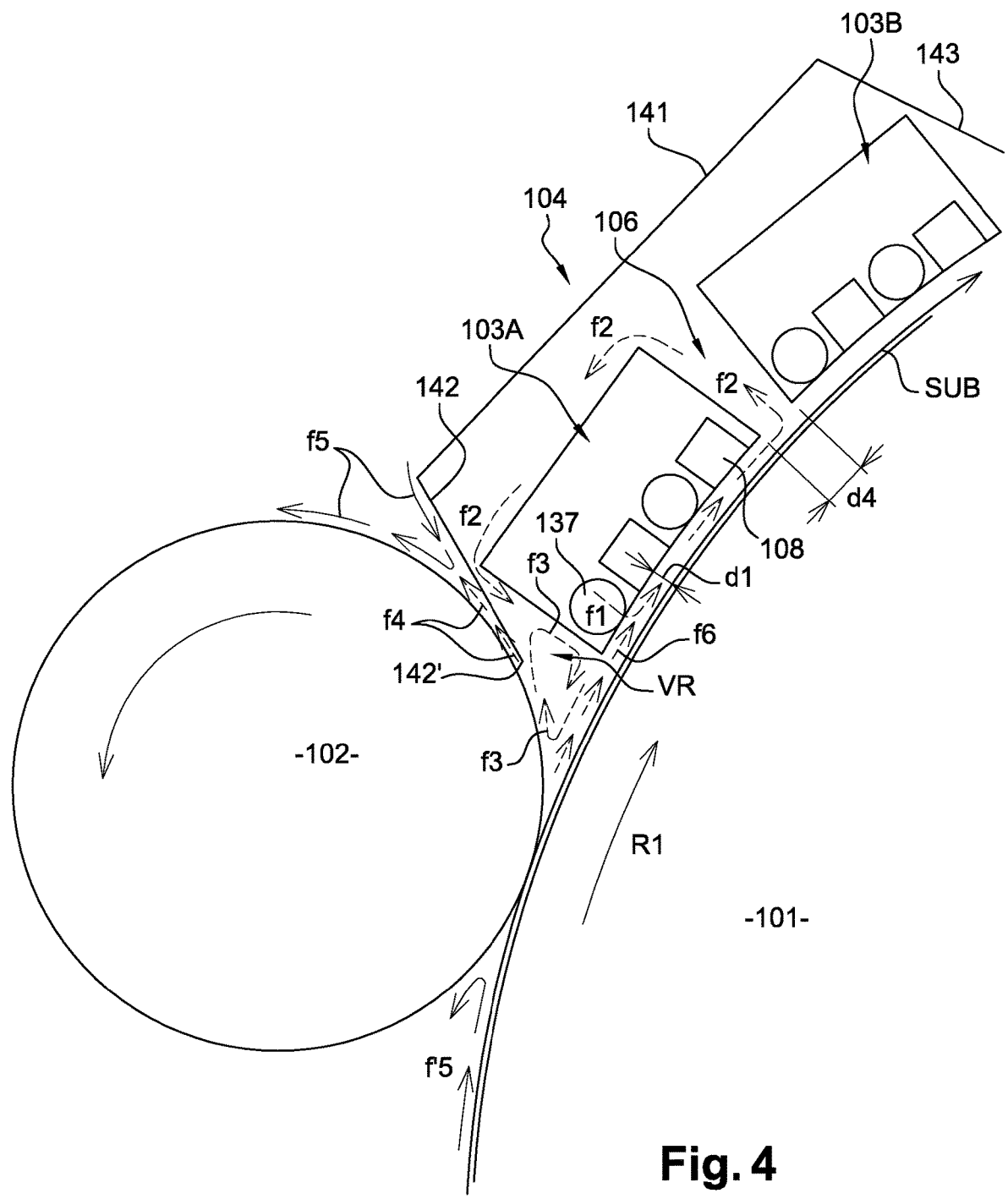
FIG. 4 is a front view, similar to FIGS. 2 and 3, illustrating a surface-treatment facility according to a second embodiment of the invention.
Figure 5:
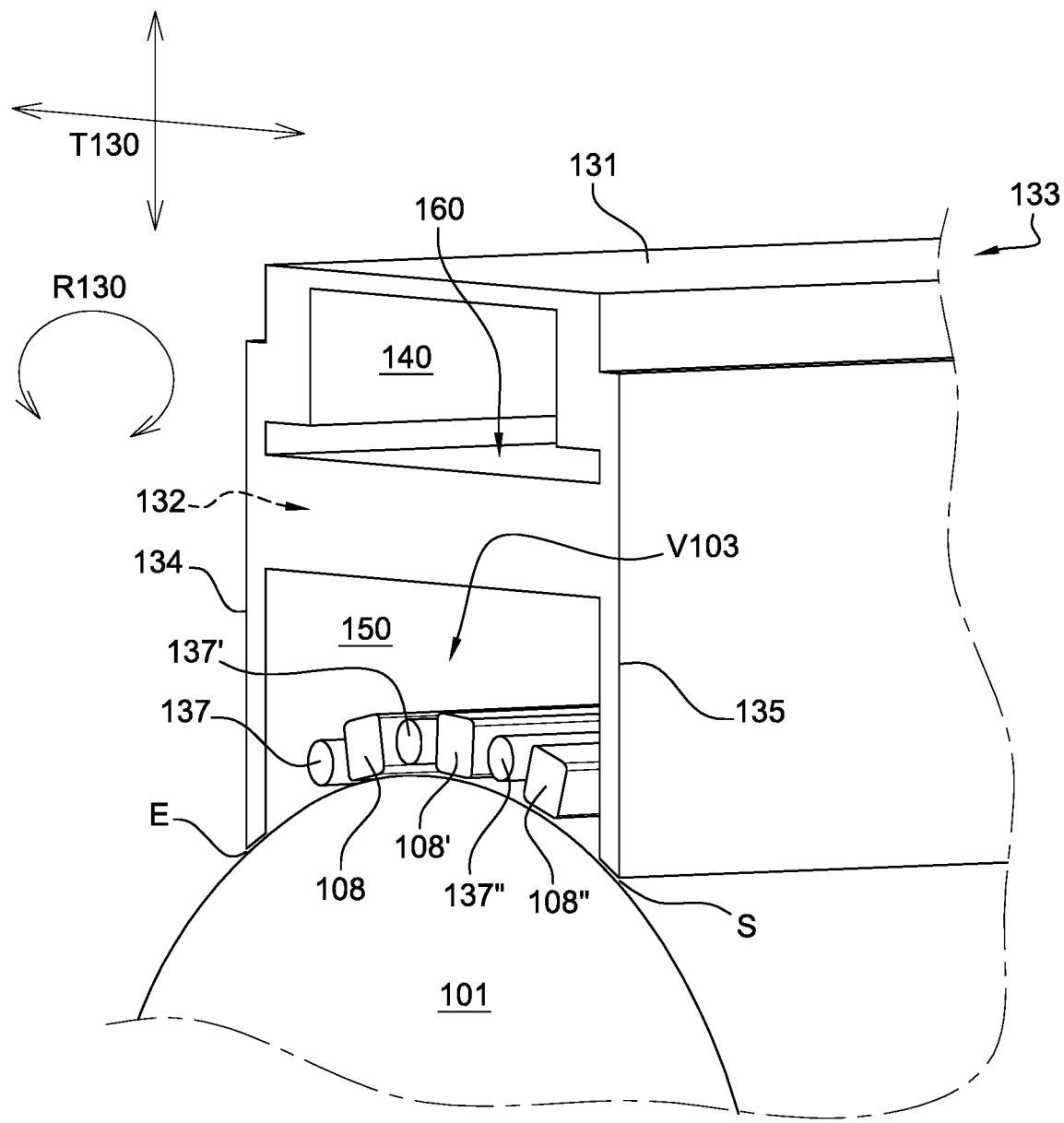
FIG. 5 is a perspective view illustrating a surface-treatment head forming part of the facility in FIG. 4.

FIGS. 4 and 5 illustrate a surface-treatment facility according to a second variant embodiment of the invention. In these figures, the mechanical elements, similar to those in FIGS. 1 to 3, are allocated therein the same reference numbers increased by 100. This second embodiment differs from the first essentially in that the treatment unit comprises at least one head open in the direction of the drum 1. In the example illustrated, a plurality of heads 103A and 103B are provided, which are advantageously identical. Thus only the structure of the head 103A will be described, with reference in particular to the perspective of FIG. 5.

This head 103, which is provided above the drum 1, is equipped with tubes and electrodes, as will be explained hereinafter. This head extends over an arc of a circle defined by the drum 1, approximately centrally. It comprises a cover 131 and peripheral walls, formed by front and rear parallel walls 132 and 133, as well as by lateral walls 134 and 135. By way of example, it is produced from PET (polyethylene terephthalate). The head is fixed to the cover 4, by any suitable means, in particular removably.

The head 103 differs mainly from the block of the first embodiment in that it does not have a substantially solid bottom wall, such as the one with which this block is provided. This head 103 therefore defines an internal volume V103 that is open in the direction of the drum 1, as can in particular be seen in FIG. 5, in which the containment cover is not shown for reasons of clarity. The drum defines, with each free edge 132' and 133' of the head, two spaces forming respectively an inlet E and an outlet S.

The inlet E corresponds to the upstream side, through which the substrate is admitted, whereas the outlet S corresponds to the downstream side. This inlet E forms the upstream end of the treatment unit, in the context of the invention. The height of this inlet E also defines the distance d1, as presented with reference to the first embodiment. The height of each space E and S may be modified by moving the head 103 with respect to the drum 1 in translation (arrow T130) and/or rotation (arrow R130).

In an optional embodiment, the head is divided into two parts by a filter 160, hereinafter referred to as the top 140 and bottom 150 parts. In its top part 140, the head is provided with diffusers 142, of any suitable type, connected to a source of plasma-forming gas. This filter, which is known per se, has among other things the function of improving the homogeneity of the gas sent towards the bottom part 150 of the head.

The bottom part of the head receives first of all injection tubes 137, 137' and 137", provided three in number. It will be noted that, in FIG. 4, only two tubes are illustrated schematically. By way of variant, a different number of injection members may be provided and/or provision may be made for these injection members to be structurally different from a tube, namely that they are formed for example by a perforated bar. The bottom part of the head also receives three electrodes 108, 108' and 108", which are arranged in alternation with respect to the aforementioned tubes, in the direction of rotation of the drum.

According to other variants that are not shown, the mutual arrangements of tubes and electrodes are different. By way of example, two electrodes can be placed side by side, or a first tube can be disposed between an upstream electrode and the facing lateral wall. Two tubes may also be placed side by side, being disposed between two electrodes or between a lateral wall and an electrode. By way of example, the tubes are produced from metal, or plastics material, such as a polymer material, in particular PET.

Each tube 137, which is elongate in shape, has for example a circular cross section. The outside diameter thereof is for example between 10 and 20 millimeters. Each tube 137 is pierced for example by two parallel rows of injection orifices, in particular mutually offset, produced by any suitable method. Each electrode 108 is for example similar to the electrodes 8 of the first embodiment. This electrode may also be replaced by another electrode of a different type.

In service, provision may be made for injecting only plasma-forming gas, such as nitrogen, in the direction of the substrate. In this case, this gas is admitted through the tubes 137 and/or through the diffusers 142. By way of variant, provision may be made for injecting plasma-forming gas and auxiliary gas, in the direction of the substrate. In this case, the plasma-forming gas is typically admitted through the diffusers 142 whereas the auxiliary gas is typically admitted through the tubes 137.

In a similar manner to what was described with reference to the first embodiment, the facility according to this second embodiment allows the creation of a recirculation volume VR, visible in FIG. 4. In this figure, the pathway of the air is shown by solid lines whereas the pathway of the plasma-forming gas is represented by broken lines. This volume is delimited respectively by the three same passages of reduced cross section:

the first (of cross section d1) is provided between the inlet E of the first head 103A and the substrate SUB passing over the support roll 101, the second (of cross section d2) is provided between the pressing roll 102 and the edge 142' of the containment cover 104, and the third (of cross section d3) is provided between the wing 142 of the containment cover 104 and the treatment head 103A.

More precisely, the plasma-forming gas injected out of the volume V103 of the head 103A flows first of all in the downstream direction along the arrows f1, and is then recirculated towards the upstream side of this head 103A, in the direction of the arrows f2. In the example illustrated, this recirculation phenomenon is improved by the injection of plasma-forming gas, effected at the second head 103B. By way of variant, for example in the case where a single head is provided, this return can be improved by using a deflector of the mechanical type, similar to the deflector 5 in FIG. 3.

The facing walls of the two heads 103A and 103B define a recirculation path 106 for the plasma-forming gas, in which the latter flows radially towards the outside of the support 101. The distance separating these two heads is denoted d4, which defines the cross section of this recirculation path. This value of d4 is similar to that described above, just like the values of d1 and d3.

The plasma-forming gas, thus returned towards the upstream side, is admitted into the aforementioned volume VR. This gas is then subjected to recirculation in this volume, in the direction of the arrows f3. Some of this gas inhibits the boundary layer on the pressing roll and is then entrained to the outside, in the direction of the arrows f4. This prevents the entry of air, which is returned in the direction of the arrows f5, because of the presence of the smaller space d2. Another part of the plasma-forming gas, which inhibits the boundary layer of the substrate downstream of the pressing roll, is entrained under the block in the direction of the arrows f6.

Figure 6:
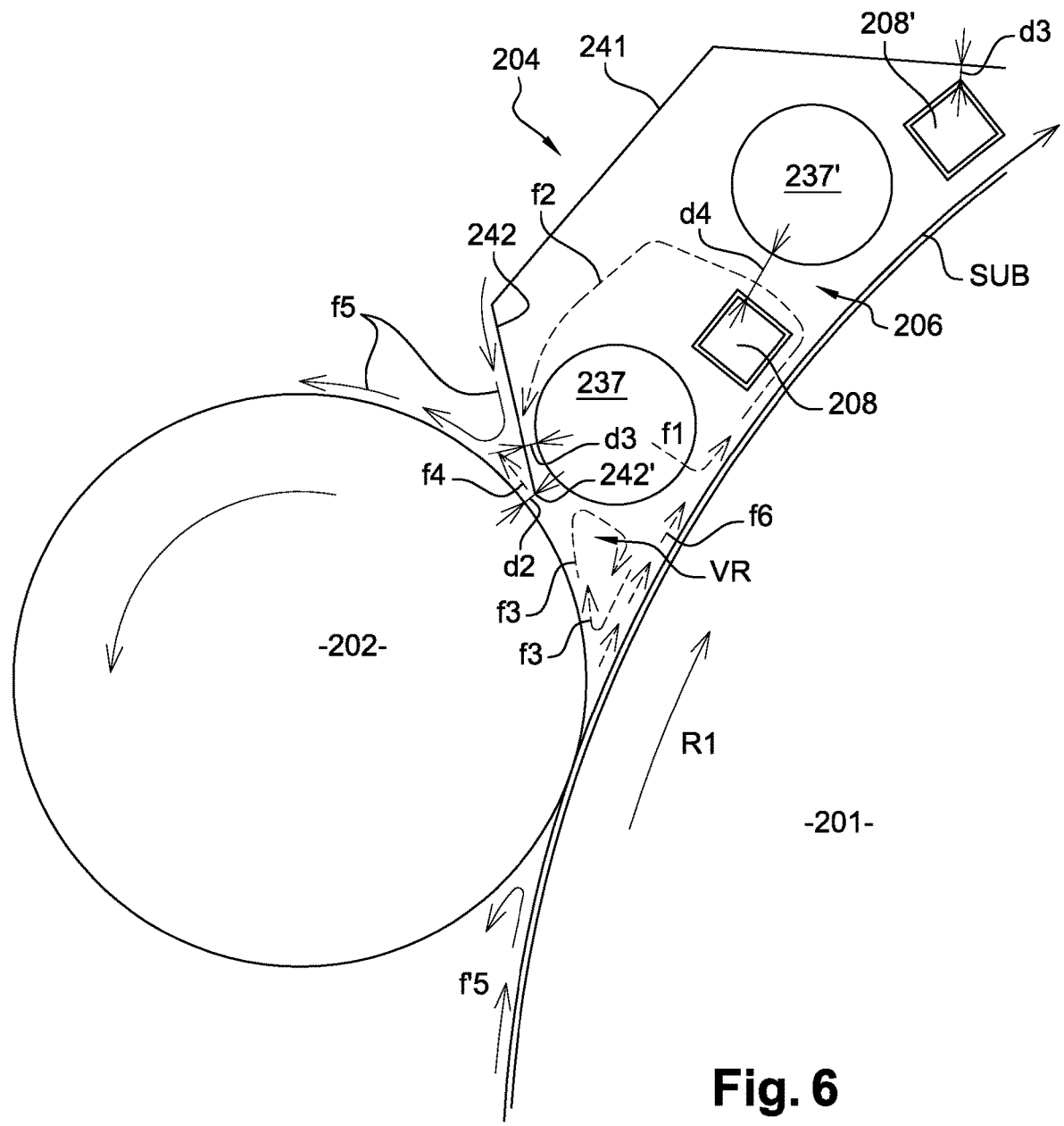
FIG. 6 is a front view, similar to FIGS. 2 and 3, illustrating a surface-treatment facility according to a third embodiment of the invention.

FIG. 6 illustrates a surface-treatment facility according to a third variant embodiment of the invention. In this figure the mechanical elements, similar to those in FIGS. 1 to 3, are therein allocated the same reference numbers increased by 200.

This third embodiment differs from the second embodiment mainly in that the treatment unit comprises a succession of injection tubes and electrodes that are received directly in the containment cover 204. In other words, this third embodiment does not have recourse to an intermediate mechanical member, such as the head 103, interposed between the containment cover and the tubes and electrodes.

The injection tubes and the electrodes are therefore fixed directly to the lateral walls of the cover, in a similar manner to the fixing thereof on the head in the second embodiment.

Moreover, these tubes and electrodes have dimensions similar to those of the tubes and electrodes of the second embodiment. In the example illustrated, two injection tubes 237 and 237' are found, as well as two electrodes 208 and 208', these tubes and electrodes being provided in alternation in the direction of travel of the substrate. By way of variant, a different number and/or arrangement of these tubes and electrodes may be provided.

In service, provision may be made for injecting only plasma-forming gas, such as nitrogen, in the direction of the substrate. In this case, this gas is admitted through the tubes 237. By way of variant, it is possible to inject plasma-forming gas and auxiliary gas, in the direction of the substrate.

In a similar fashion to what was described with reference to the first embodiment, the facility according to this third embodiment allows the creation of a recirculation volume VR, visible in FIG. 6. In this figure, the pathway of the air is represented by solid lines, whereas the pathway of the plasma-forming gas is represented by broken lines. This volume is delimited respectively by the same three passages of reduced cross section:

the first (of cross section d1) is provided between the bottom face of the upstream tube 237 and the substrate SUB travelling over the support roll 101, the second (of cross section d2) is provided between the pressing roll 102 and the edge 242' of the containment cover 204, and the third (of cross section d3) is provided between the containment cover 204 and the upstream tube 237.

More precisely, the plasma-forming gas injected out of the upstream tube 237 flows first of all downstream in the direction of the arrows f1, and is then sent towards the upstream side of this tube 237, along the arrows f2. In the example illustrated, this return phenomenon is improved by the injection of plasma-forming gas, effected at the downstream tube 237'. By way of variant, for example in the case where a single head is provided, this return may be improved by using a deflector of the mechanical type, similar to the deflector 5 in FIG. 3.

The facing walls of the upstream electrode 208 and of the downstream tube 237' define a recirculation path 206 for the plasma-forming gas, in which the latter flows radially towards the outside of the support 201. The distance separating this upstream electrode 208 and this downstream tube 237' is denoted d4, which defines the cross section of this recirculation path. The distance separating the two heads is denoted d4, which defines the cross section of this recirculation path. This value of d1 is similar to that described above, just like the values of d1 to d3.

The plasma-forming gas thus returned upstream is admitted into the aforementioned volume VR. This gas is then subjected to recirculation in this volume, along the arrows f3. Part of this gas inhabits the boundary layer on the pressing roll and is then entrained to the outside, along the arrows f4. This prevents the penetration of air, which is returned along the arrows f5, because of the presence of the small space d2. Another part of the plasma-forming gas, which inhabits the boundary layer on the substrate downstream of the pressing roll, is entrained under the block along the arrows f6.

The invention is not limited to the examples described and depicted. Thus, as mentioned at the start of the description of the figures, the treatment implemented according to the invention may be of a type different from plasma treatment. Moreover, the support of the substrate may be different from a rotary drum. In a variant, it may in particular be an immobile flat support, such as a plate, on which the moving substrate passes.

EXAMPLES

The invention is illustrated below by examples that do not however limit the scope thereof. These examples relate to a type of plasma treatment and to the measurement of the level of oxygen in the containment chamber.

Example 1: Measurement of the Efficacy of the Treatment with and without Pressing Roll A facility such as the one described in FIGS. 1 to 3 is used. This facility comprises:
a drum 1 the diameter of which is 400 mm
a pressing roll 2 the diameter of which is 100 mm
seven identical treatment blocks, such as the block 3A. Each has injection orifices 37 with a surface area of 400 $mm^2$.

The characteristic dimensions of the facility are as follows:
distance d1=1 mm
distance d2=4 mm
distance d3=12 mm
distance d4=1 mm
distance d5=5 mm A film of BOPP, the width of which is 550 mm and the thickness of which is 20 μm, is passed at a speed of 400 meters per minute. Nitrogen N2 is used as the plasma-forming gas.

The surface energy obtained is measured after treatment with test inks calibrated in accordance with ASTM D-2578. Before treatment the film has a surface energy of 30 mN/m.

In a first implementation according to the invention, the plasma-forming gas is injected at respective rates of 50 $m^3/h$. This configuration led to a surface energy of 58 mN/m.

Next, for comparison, a second implementation was carried out, which was not in accordance with the invention. For this purpose, the pressing roll was not used. This configuration led to a surface energy of 44 mN/m.

Example 2: Measurement of the Inserting of the Containment Chamber with and without Pressing Roll at Various Passage Speeds The same facility as the one in example 1 above is used. Nitrogen is injected into the seven successive blocks over a width of 200 mm at a total rate of 25 $m^3/h$. The oxygen level is measured in the containment chamber above the blocks.

As from a certain speed, in the example (300 m/min), the quantity of nitrogen injected is no longer sufficient to compensate for the addition of oxygen entrained by the passage of the film and the proportion of oxygen increases. When the pressing roll 2 (or "nip") is used in accordance with the invention, the lamination effect of the oxygen admitted makes it possible to increase the speed while keeping the oxygen level acceptable for the plasma treatment without increasing the nitrogen flow.

Figure 7:
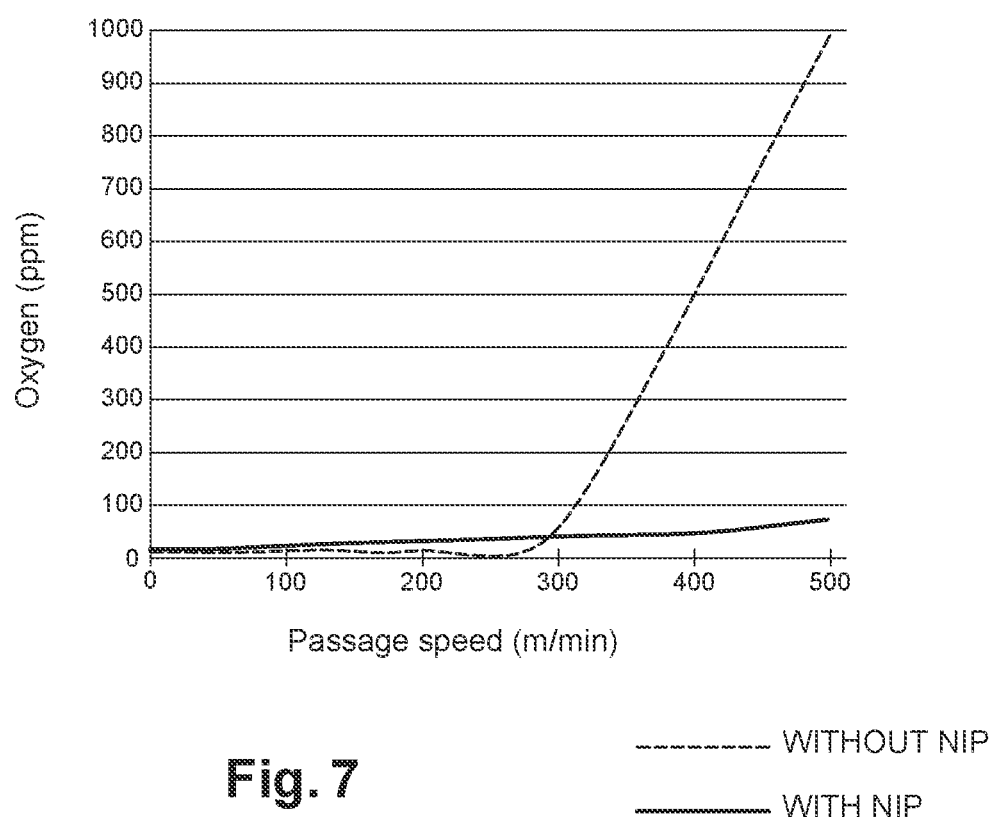
FIG. 7 is a curve illustrating the variations in the level of oxygen in the containment chamber, forming part of the facility according to the invention, as a function of the speed of travel of the substrate.

The variations in the oxygen level in the containment chamber, as a function of the passage speed of the substrate, are illustrated in the accompanying FIG. 7. In this figure, the solid curve illustrates this variation with the use of a pressing roll according to the invention, while the broken curve illustrates this variation in the absence of such a roll.

We claim:

1. A facility for treating a surface of a moving substrate, the facility comprising:
  a support for the substrate;
  a pressing roll to press the moving substrate against said support;
  a treatment unit positioned downstream of the pressing roll relative to a direction of travel of the moving substrate, the treatment unit including:
    a solid block formed by a top wall, peripheral walls, lateral walls, a front wall, a rear wall, and a bottom wall, the solid block including a plurality of orifices extending between the lateral walls, the plurality of orifices being connected to a source for injecting a treatment gas towards said support; and
    an electrode provided in the solid block to generate an electric discharge which transforms a surface of the moving substrate;
  a containment cover to receive the treatment unit in an inner volume formed by the containment cover and the support, the containment cover including a front upstream wall facing towards the pressing roll, the front upstream wall having an end edge positioned adjacent to the pressing roll; and
  a recirculation path, arranged inside the inner volume formed by the containment cover and the substrate, to recirculate some of the treatment gas injected by the plurality of orifices upstream of the orifices, the recirculation path defining a recirculation volume for the treatment gas, defined by the end edge of the upstream front wall, the pressing roll, the support, and an upstream end of the treatment unit,
  wherein:
    a distance between the pressing roll and the treatment unit is less than 10 millimeters,
    a distance between the upstream front wall and the treatment unit is less than 20 millimeters, and
    the distance between the pressing roll and the treatment unit is greater than the distance between the end edge of the upstream front wall and the pressing roll.

2. The facility of claim 1, wherein a distance between the end edge of the upstream front wall and the pressing roll is less than 5 millimeters.

3. The facility of claim 1, wherein the distance between the upstream front wall and the treatment unit is less than 2 millimeters.

4. The facility of claim 1, wherein a distance between the upstream end of the treatment unit and the support is less than 5 millimeters.

5. The facility of claim 1, wherein the distance between the pressing roll and the treatment unit is less than 5 millimeters.

6. The facility of claim 1, wherein the plurality of orifices is arranged linearly in a direction perpendicular to the direction of travel of the moving substrate.

7. A facility for treating a surface of a moving substrate, the facility comprising:
  a support for the substrate;
  a pressing roll to press the moving substrate against said support;
  a treatment unit positioned downstream of the pressing roll relative to a direction of travel of the moving substrate, the treatment unit including:
    a plurality of solid blocks, each solid block in the plurality of solid blocks formed by a top wall, peripheral walls, lateral walls, a front wall, a rear wall, and a bottom wall, the solid block including a plurality of orifices extending between the lateral walls, the plurality of orifices being connected to a source for injecting a treatment gas towards said support; and
    an electrode provided in each solid block to generate an electric discharge which transforms a surface of the moving substrate;
  a containment cover to receive the treatment unit in an inner volume formed by the containment cover and the support, the containment cover including a front upstream wall facing towards the pressing roll, the front upstream wall having an end edge positioned adjacent to the pressing roll; and
  a recirculation path, arranged inside the inner volume formed by the containment cover and the substrate, to recirculate some of the treatment gas injected by the plurality of orifices upstream of the orifices, the recirculation path defining a recirculation volume for the treatment gas, defined by the end edge of the upstream front wall, the pressing roll, the support, and an upstream end of the treatment unit,
  wherein:
    a distance between the pressing roll and the treatment unit is less than 10 millimeters,
    a distance between the upstream front wall and the treatment unit is less than 20 millimeters, and
    the distance between the pressing roll and the treatment unit is greater than the distance between the end edge of the upstream front wall and the pressing roll.

8. The facility of claim 7, wherein each solid block in the plurality of solid blocks is arranged behind another solid block in the plurality of solid blocks in the direction of travel of the substrate.

9. The facility of claim 7, wherein the distance between the end edge of the upstream front wall and the pressing roll is less than 5 millimeters.

10. The facility of claim 7, wherein the distance between the upstream front wall and the treatment unit is less than 2 millimeters.

11. The facility of claim 7, wherein a distance between the upstream end of the treatment unit and the support is less than 5 millimeters.

12. The facility of claim 7, wherein the distance between the pressing roll and the treatment unit is less than 5 millimeters.

13. The facility of claim 7, wherein the plurality of orifices is arranged linearly in a direction perpendicular to the direction of travel of the moving substrate.

* * * * *